(12) United States Patent
Miyachi

(10) Patent No.: US 6,258,492 B1
(45) Date of Patent: Jul. 10, 2001

(54) X-RAY MASK STRUCTURE AND METHOD OF MAKING THE SAME

(75) Inventor: Takeshi Miyachi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/383,626

(22) Filed: Aug. 26, 1999

(30) Foreign Application Priority Data

Aug. 26, 1998 (JP) .................................................. 10-240251
Aug. 18, 1999 (JP) .................................................. 11-231474

(51) Int. Cl.[7] .................................................. G03F 9/00
(52) U.S. Cl. .............................. 430/5; 430/296
(58) Field of Search ............................... 430/5, 322, 296; 378/35

(56) References Cited

U.S. PATENT DOCUMENTS 6,007,948 * 12/1999 Cummings .............................. 430/5

FOREIGN PATENT DOCUMENTS 2-100311   4/1990   (JP) .

* cited by examiner

*Primary Examiner*—S. Rosasco
(74) *Attorney, Agent, or Firm*—Fitzpatrick, Cella, Harper & Scinto

(57) ABSTRACT

A method of producing a mask for use in lithography is disclosed, wherein a structure having a membrane and a mask substrate for supporting the membrane are prepared, while a pattern is to be formed on the membrane, wherein a force is applied to the structure so that distortion is produced in the membrane, and wherein a pattern is formed on the membrane with the force being applied to the membrane, whereby accurate magnification correction can be accomplished.

10 Claims, 6 Drawing Sheets

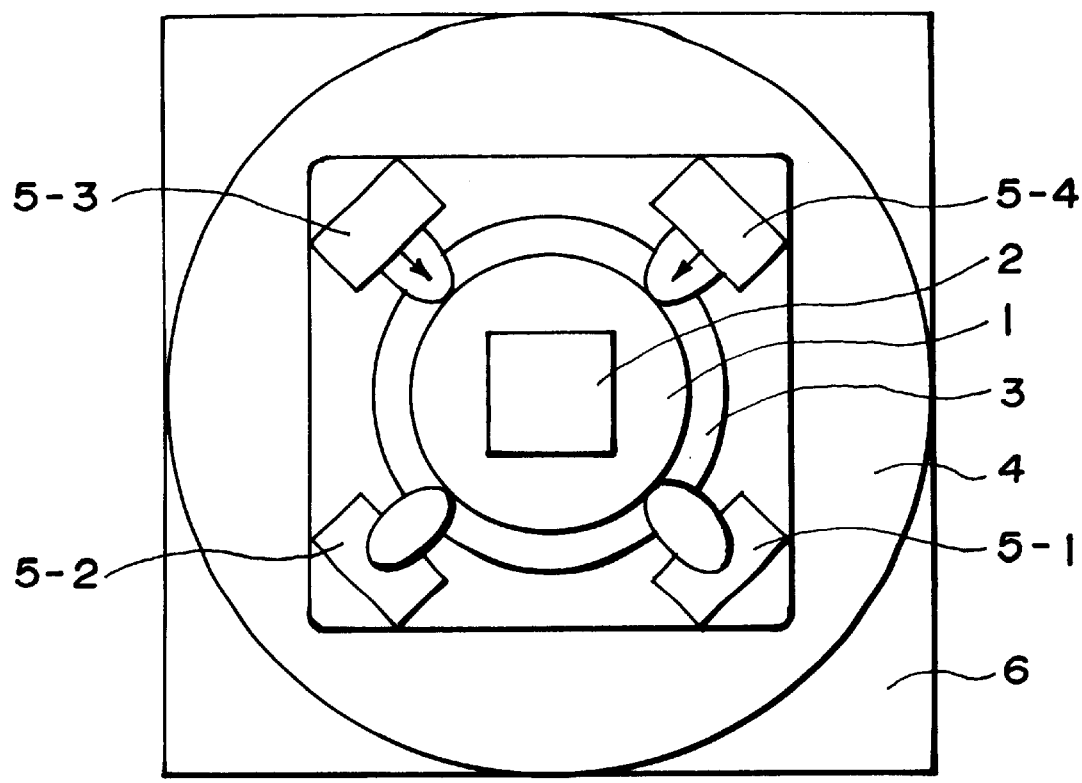
FIG. IA
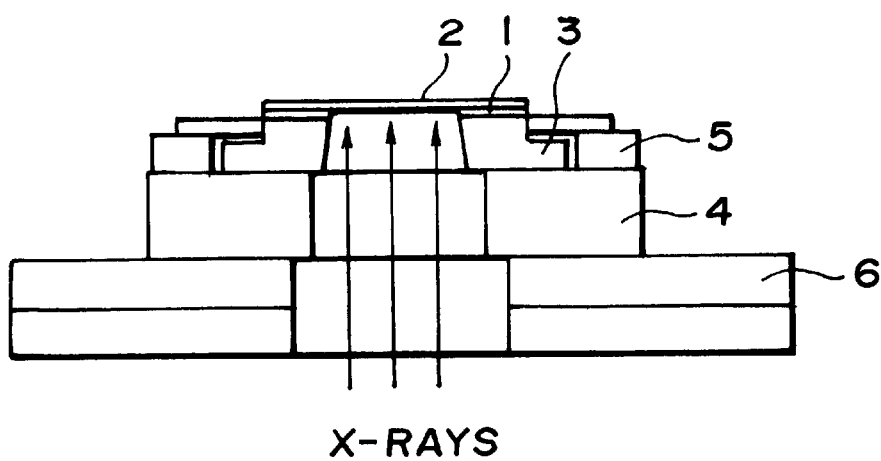
X-RAYS
FIG. IB

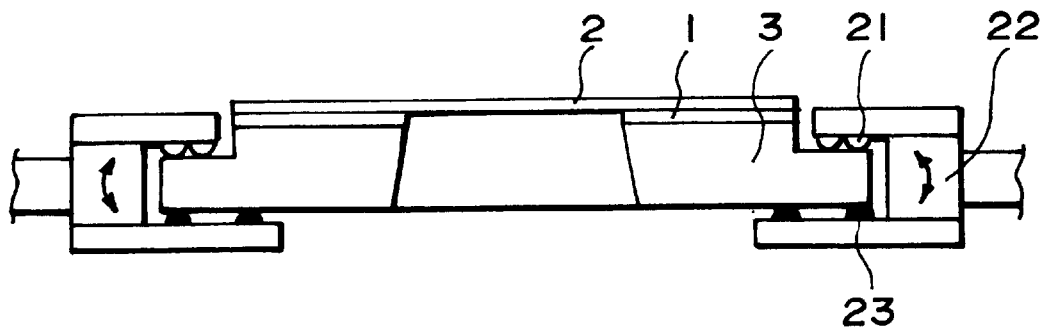
F I G. 4A
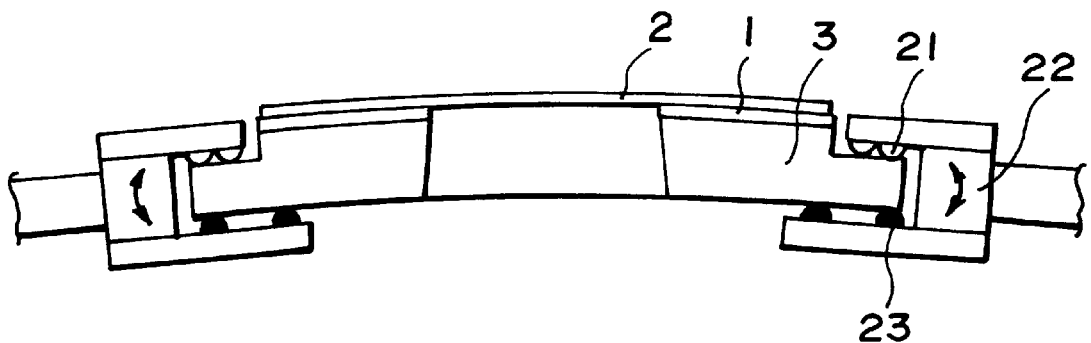
F I G. 4B
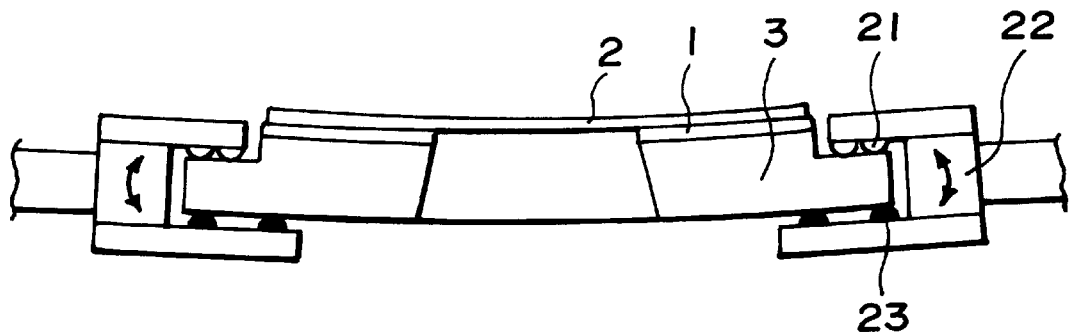
F I G. 4C

X-RAY MASK STRUCTURE AND METHOD OF MAKING THE SAME

FIELD OF THE INVENTION AND RELATED ART

This invention relates to a mask and a method of making the same, suitable for use in the manufacture of semiconductor devices, for example. In another aspect, the invention is concerned with an exposure method and a device manufacturing method which use such a mask.

For further improvement of integration density and operation speed of a semiconductor device such as an LSI, miniaturization of a circuit pattern has been continuously pursued. In an exposure process of lithography for the device manufacture, a higher resolution is attainable with a shorter exposure wavelength. In this respect, fine-pattern formation which is based on high-luminance x-rays from a synchrotron radiation (SR) light source, for example, becomes attractive.

As an example of x-ray exposure, Japanese Patent Application Laid-Open No. 100311/1990 discloses a proximity unit-magnification x-ray exposure method which uses soft x-rays of about 0.5–2 nm. In principle, a high resolution of not greater than 0.1 micron may be attainable. This x-ray exposure method uses a transmission-type mask called an "x-ray mask" (which may be called a "reticle"). The portion of this mask through which x-rays pass is called a "membrane", and generally it comprises a thin film of a thickness of about 2 microns and a size of 35–50 mm square. A circuit pattern formed on this membrane is made of an x-ray absorbing material having a thickness of about 0.5 micron. For projection of the mask circuit pattern onto a wafer substrate, the x-rays from a light source are projected to the x-ray mask, whereby the mask pattern is transferred to the wafer which is placed opposed to and in proximity with the mask.

In the x-ray unit-magnification exposure method, however, since the mask and the wafer are placed close to each other and there is no reduction projection optical system therebetween, it is difficult to adjust the transfer magnification of a pattern to be transferred to the wafer.

SUMMARY OF THE INVENTION

An external force may be applied to an x-ray mask to change the magnification of the mask pattern (to adjust the mask pattern size) formed on the x-ray mask, in accordance with the wafer pattern magnification. It is accordingly an object of the present invention to provide a method and/or a structure which accomplishes this on a practical level.

It is another object of the present invention to provide an improved method of making a mask by which high precision pattern transfer can be accomplished.

It is a further object of the present invention to provide a high-precision device manufacturing method using such a mask.

These and other objects, features and advantages of the present invention will become more apparent upon consideration of the following description of the preferred embodiments of the present invention taken in conjunction with the accompanying drawings.

BRIEF DESCRIPTION OF THE DRAWINGS

FIGS. 1A and 1B are schematic views, respectively, for explaining a chuck magnification correcting mechanism of an x-ray exposure apparatus to be used in an embodiment of the present invention.

FIGS. 4A, 4B and 4C are schematic views, respectively, for explaining another example of a chuck magnification correcting mechanism and a mask magnification mechanism for electron beam drawing.

DESCRIPTION OF THE PREFERRED EMBODIMENTS

Figure 2A:
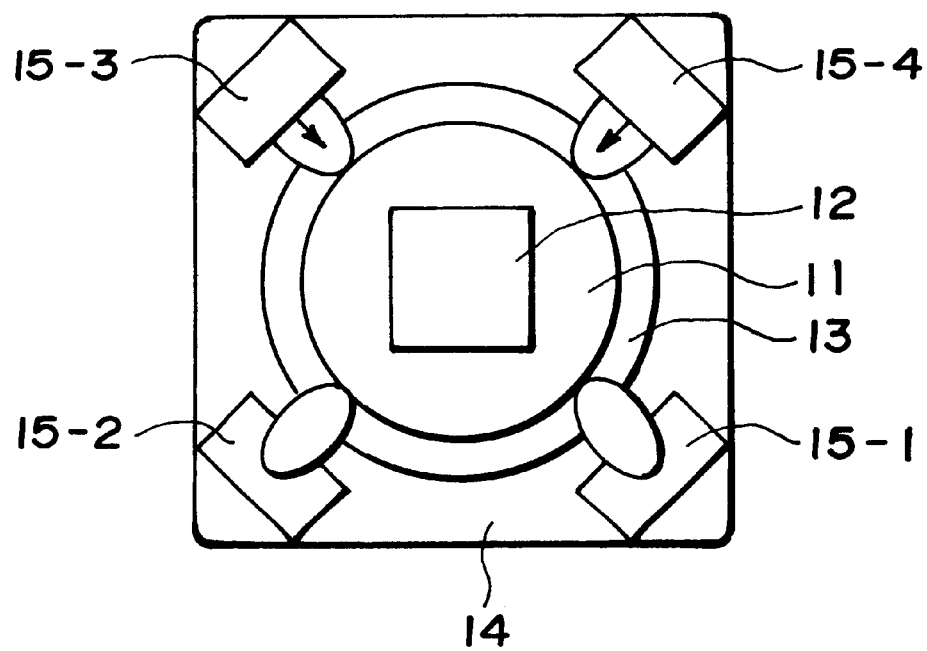
FIGS. 2A and 2B are schematic views, respectively, for explaining a cassette with a mask magnification mechanism, for an electron beam patterning process, to be used in an embodiment of the present invention.
Figure 2B:
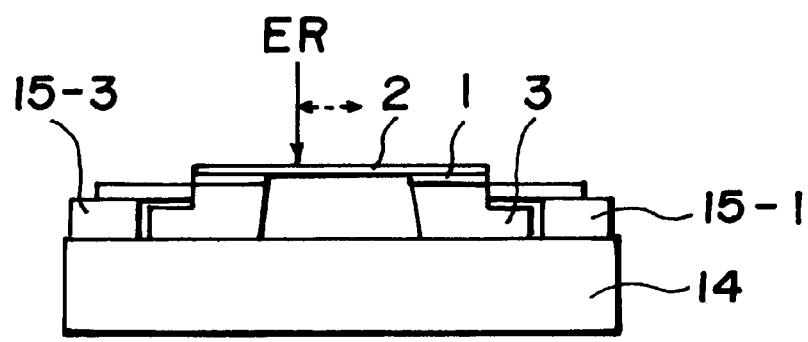

FIGS. 1A and 1B show a holding mechanism to be accommodated in an x-ray exposure apparatus, for holding an x-ray mask, wherein FIG. 1A is a plan view and FIG. 1B is a sectional view. FIGS. 2A and 2B show a mask holding mechanism in an electron beam (EB) pattern drawing apparatus to be used in the manufacture of a mask, wherein FIG. 2A is a plan view and FIG. 2B is a sectional view.

In FIGS. 1A and 1B, an x-ray mask structure comprises a mask substrate 1 of silicon, for example, a membrane 2, and a mask frame 3. The mask frame 3 functions to reinforce the mask substrate 1, and they are bonded to each other. These elements provide an x-ray mask structure. A portion of the top surface side of the mask frame 3, along its outside periphery, is cut, such that the mask frame 3 has two side faces of different radii.

An x-ray mask may be made as follows. Initially, a film of SiN or SiC is formed on the surface of a mask substrate 1. After this, the mask substrate 1 is back-etched, from one side thereof, to remove unnecessary portions thereof, whereby a membrane 2 of SiN or SiC is produced. Then, the patterning of the membrane 2 surface is performed by using an x-ray absorbing material (e.g., heavy metal such as W or Ta) and through an electron beam patterning apparatus, whereby a mask pattern (not shown) is produced thereon.

Denoted at 4 is a chuck for holding the mask. Denoted at 5-1 and 5-2 are abutment stops. Denoted at 5-3 and 5-4 are pressing means, each comprising a pressing air cylinder and a pressure detector (load cell) for detecting and monitoring the pressing force to control the same. The pressing mechanism is not limited to an air cylinder, and a piezoelectric device may be used, for example. Denoted at 6 is a stage for moving and positioning the mask held by the chuck 4.

The components 5-1, 5-2, 5-3 and 5-4 provide a magnification correcting mechanism. This mechanism functions to apply a force to the side face of the mask frame 3 (the side face of a smaller radius) in a direction parallel to the pattern surface, to press the same. As a result, forces are applied to the rectangular membrane window, in directions along extensions of diagonals of the same, whereby distortion is applied to the membrane. The portion where the force is applied is not limited to the mask frame side face. A force may be applied to the side face of the mask substrate 1. What is necessary is that a predetermined distortion is applied to the mask membrane.

FIGS. 2A and 2B show a holding mechanism (mask cassette) for holding a mask in an electron beam drawing apparatus for mask pattern formation. This holding mechanism has a structure and a function similar to those of the chuck in the x-ray exposure apparatus of FIGS. 1A and 1B. Denoted at 14 is a chuck, and denoted at 15-1 and 15-2 are abutment stops. Denoted at 15-3 and 15-4 are pressing means for applying a pressing force to the side face of a mask frame 3, held by the chuck, in a direction along the plane of the pattern surface. Each pressing means comprises a piezoelectric device for producing a force and a pressure detector (load cell). The piezoelectric device produces a force, and the pressing force is controlled on the basis of the detection through the pressure detector. The portion where the force is applied is not limited to the mask frame side face. A force may be applied to the side face of the mask substrate 1. What is necessary is that a predetermined distortion is applied to the mask membrane. In place of the piezoelectric device, a mechanism based on a spring or a cylinder for producing the pressing force may be used.

In the pattern drawing for mask production, a pressing force approximately equal to that applied as the mask is held in an x-ray exposure apparatus using the mechanism shown in FIG. 2 is applied to substantially the same locations on the mask structural members. By doing so, in the mask pattern production using the electron beam drawing, the mask can be held under substantially the same condition as that when the mask is put into practical use in the x-ray exposure apparatus. Therefore, the pattern drawing can be performed with distortion substantially equivalent to that applied as the mask is put into practical use.

In regard to the external force to be applied to the mask, a force corresponding to a wafer magnification change as can be measured beforehand or a force corresponding to an intermediate (½) of the specification maximum stroke, may be applied. The quantity of magnification change as predetected, due to a wafer process, for example, may be calculated in terms of the quantity of mask pattern magnification, and the thus calculated value may be converted into a pressing force. The converted pressing force may be applied to the mask, and the electron beam pattern drawing may be performed in accordance with a design value (the size without magnification). If a magnification change can not be measured beforehand, a pressing force corresponding to a magnification change equivalent to a half of the specification magnification correction stroke may be applied, and the pattern drawing may be performed in accordance with the design value. When the mask is unloaded from the holding mechanism, the size of the thus produced mask pattern is slightly larger than the size as drawn.

An x-ray mask can be produced in the manner described above. The x-ray exposure process using such a mask may be as follows. An x-ray mask is loaded and chucked by the holding mechanism of the x-ray exposure apparatus shown in FIGS. 1A and 1B. Then, using the pressing mechanism, a pressing force corresponding to the predetected magnification change, due to a wafer process, for example, as being converted into an external force, is applied to the mask. As a result, the size of the mask pattern can be brought into a state where the design value in the electron beam patterning is reproduced and there is no error. On the other hand, a wafer which is a substrate to be exposed, is disposed and positioned in proximity with and opposed to the mask. For higher overlay precision, it is desirable that, before the exposure process, the magnification of the mask pattern (i.e., the size of the pattern) is corrected minutely. Thus, the magnification correcting mechanism is used again to change the pressing force so as to change the size of the mask pattern, whereby the magnification correction is performed. Here, with regard to the amount of correction, if the magnification change has been measured beforehand accurately, the amount of magnification correction can be small, such that a magnification correcting method with small error is accomplished. After completion of the correction as described, x-rays are projected to the x-ray mask, whereby the mask pattern is transferred to the wafer.

Figure 3:
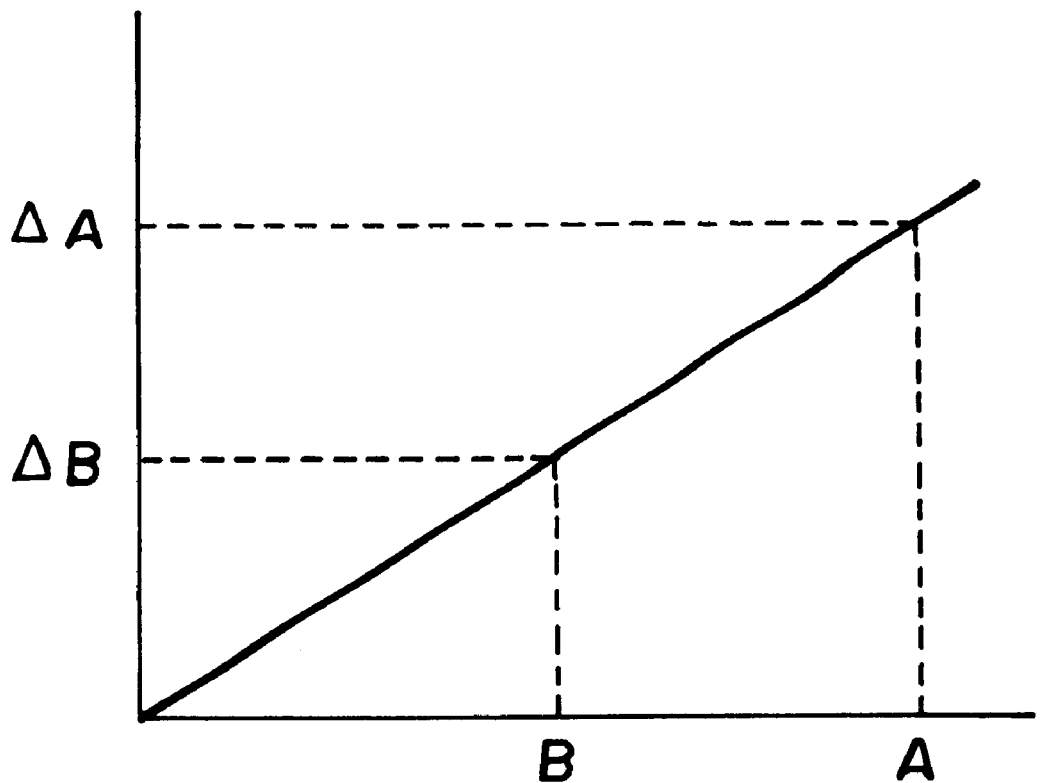
FIG. 3 is a graph for explaining errors with a change in magnification.

The present embodiment provides advantages such as follows. In a case where an external force is applied to the outside periphery of an x-ray mask to perform the magnification correction in both the positive and negative direction (enlargement and reduction) with respect to a designed pattern size, the mask pattern can be registered with the design value if the patterning is made beforehand with a size larger than the design size and, in the x-ray exposure process, the external force is applied so that the magnification becomes equal to the intermediate value. In that occasion, as shown in FIG. 3, the error becomes larger in proportion to the magnitude of the magnification change. In FIG. 3, the abscissa denotes the magnification change, and the axis of ordinate corresponds to the error caused by the magnification change. If the largest stroke value of the magnification change is denoted by A, the error corresponding to it becomes equal to ΔA. In order that the mask pattern magnification is registered with the design value in the initial state, it is necessary that the magnification correction mechanism of the x-ray exposure apparatus is used to apply an external force to cause the magnification change up to the position B, to thereby apply an intermediate value. In the stage of this initial value, there occurs an error ΔB due to the mask magnification. This error is adversely influential to the pattern overlay precision.

In accordance with this embodiment, on the other hand, since, in the manufacture of a mask, the mask pattern is formed under similar distortion as in the practical use of the mask (i.e., during x-ray exposure), the exactly designed pattern size is accomplished without pressing when the mask is in practical use. Thus, the error becomes small (ΔA/2). Additionally, no error occurs in the initial setting (to set the intermediate value).

If the magnification change due to a process, for example, does not shift from the intermediate value uniformly in the positive and negative directions, the pressing force during the mask pattern drawing may not be set to the intermediate value but to a largest distribution position within the range of change by the maximum pressing. Namely, a pressing force at the positive or negative side of the intermediate value may be set.

FIGS. 4A–4C are schematic views, respectively, for explaining another embodiment of an x-ray mask holding mechanism to be accommodated in an x-ray exposure apparatus, or of a mask holding mechanism for holding a mask in an electron beam patterning apparatus for use in mask manufacture. Since the holding mechanism in the x-ray exposure apparatus and the holding mechanism in the electron beam patterning apparatus may have a similar structure, they will be explained together with reference to FIGS. 4A–4C. Like numerals as of the preceding embodiment are assigned to corresponding elements. In this embodiment, the mechanism is structured so that the force for producing distortion in the pattern, which is applied to the pattern in the preceding embodiment in a direction along the pattern surface, is applied in a direction outward from the pattern surface.

FIG. 4A shows a case where a mask is held flat. FIGS. 4B and 4C show cases where the whole mask is distorted or strained upward and downward, respectively. Denoted in these drawings at 21 and 23 are mask fixing portions for fixedly holding the mask in a direction perpendicular to the pattern surface on the membrane 2. Denoted at 22 is a mechanism for applying displacement to the mask, in a direction outward from the pattern surface. A mask frame 3 is held fixed inside an x-ray exposure apparatus by means of these fixing portions 21 and 23 and, additionally, the fixing portions 21 and 23 are shifted in a vertical direction along the direction of an arrow by means of the mechanism 22. By this, distortion in a direction outward from the pattern surface is applied to the mask membrane 2, whereby the magnification of the pattern is changed. Thus, the fixing portions 21 and 23, as well as the mechanism 22, provide a magnification correcting mechanism.

In the electron beam patterning apparatus, on the other hand, by means of the holding mechanism of FIG. 4B or 4C, during the pattern drawing process for the mask production, the mask is held in substantially the same condition as in practical use of the mask in an x-ray exposure apparatus. Thus, the pattern drawing can be performed while distortion, substantially equivalent to that in practical use of the mask, is applied to the membrane. As regards the external force to be applied to the mask in a direction outward from the same, the quantity of wafer magnification change due to a wafer process, for example, and being measured beforehand may be converted into a quantity of mask pattern magnification change, and a force corresponding to that mask pattern magnification change may be applied. Alternatively, a force corresponding to an intermediate (½) of the specification maximum stroke of the magnification correcting mechanism of the x-ray exposure apparatus may be applied. Through the pattern drawing with the intermediate value as described, the error of the mask magnification can be minimized.

While in FIGS. 4B and 4C the fixation and the force application are made to the mask frame 3, depending on the mask structure, they may be made to the mask substrate 1.

Thus, the present invention is applicable also to a magnification correction mechanism which is based on deformation outward from the pattern surface.

Next, an embodiment of a device manufacturing method which uses an x-ray mask structure such as described above will be explained.

Figure 5:
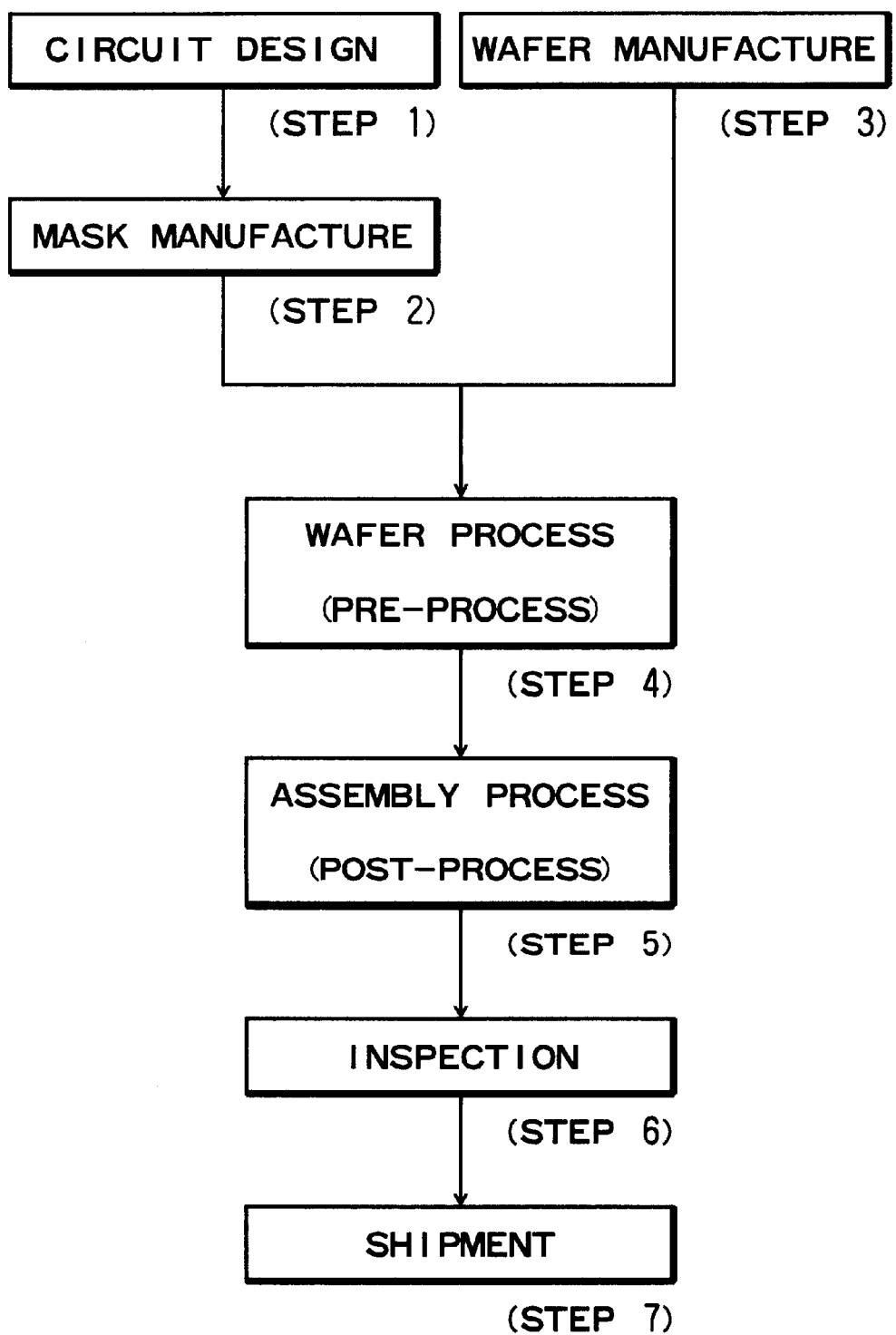
FIG. 5 is a flow chart of microdevice manufacturing process.

FIG. 5 is a flow chart of procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making an x-ray mask in accordance with any one of the mask producing methods described hereinbefore. Step 3 is a process for preparing a wafer using a material such as silicon or glass. Step 4 is a wafer process (called a pre-process) wherein, using the so prepared mask and wafer, circuits are practically formed on the wafer through lithography. Step 5 subsequent to this is an assembling step (called a post-process), wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed, and they are shipped (step 7).

Figure 6:
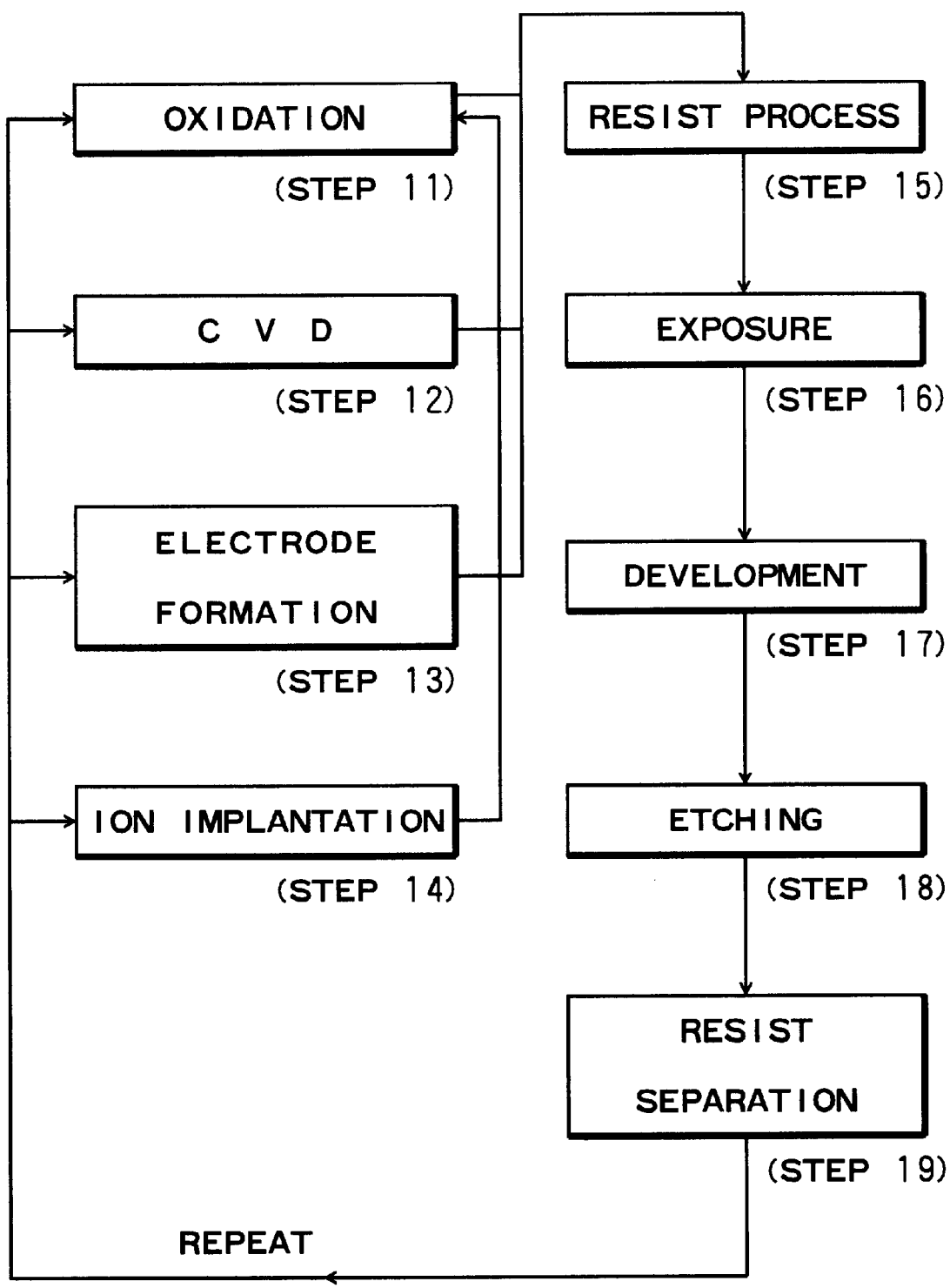
FIG. 6 is a flow chart for explaining details of a wafer process.

FIG. 6 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions into the wafer. Step 15 is a resist process for applying a resist (photosensitive material) to the wafer. Step 16 is an exposure process for printing, by exposure, the circuit pattern of the mask on the wafer through x-ray exposure as described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured with high productivity and thus with low cost.

In accordance with the embodiments of the present invention as described hereinbefore, higher precision magnification correction can be accomplished such that the transfer precision in x-ray lithography can be improved significantly. As a result, the reliability and yield of the device manufacture can be improved notably. Also, in accordance with the device manufacturing method according to the present invention, a large integration semiconductor device can be produced with low cost.

While the invention has been described with reference to the structures disclosed herein, it is not confined to the details set forth and this application is intended to cover such modifications or changes as may come within the purposes of the improvements or the scope of the following claims.

What is claimed is:

1. A method of producing a mask for use in lithography, comprising the steps of:
    preparing a structure having a membrane and a mask substrate for supporting the membrane, wherein a pattern is to be formed on the membrane;
    applying a force to the structure so that distortion is produced in the membrane; and
    forming a pattern on the membrane with the force being applied to the membrane.

2. A method according to claim 1, wherein the pattern formation is performed on the basis of electron beam exposure.

3. A method according to claim 1, wherein the structure further includes a mask frame for reinforcing the mask substrate, and wherein the force is applied to a side face of the mask frame in a direction parallel to or perpendicular to the pattern forming surface of the membrane.

4. A method according to claim 1, wherein the force is applied to a side face of the mask substrate in a direction parallel to or perpendicular to the pattern forming surface of the membrane.

5. A method according to claim 1, wherein the force to be applied has a magnitude which is determined on the basis of a force to be applied to the structure when the structure is held in an exposure apparatus.

6. A method according to claim 1, wherein the application of the force is performed with a force substantially equivalent to a force to be applied to the structure as the structure is held in an exposure apparatus, and with respect to a position substantially the same as that as the force is applied to the structure as the structure is held in the exposure apparatus.

7. A method according to claim 1, wherein the force to be applied has a magnitude which is determined on the basis of a magnification change in the pattern when the structure is used.

8. A method according to claim 1, wherein the force to be applied has a magnitude which is determined on the basis of an intermediate of a specification magnification correction stroke of an exposure apparatus with respect to the mask structure.

9. A mask structure to be held in an exposure apparatus for use in lithography, comprising:

a mask substrate; and a membrane being supported by the mask substrate and having a pattern formed thereon;

wherein the mask structure is arranged so that distortion is produced in the membrane as a force is applied to the mask structure from the exposure apparatus, and wherein the pattern on the membrane has been formed under application of a force to the membrane.

10. A device manufacturing method, comprising the steps of:

transferring a pattern of a lithographic mask onto a workpiece, wherein the lithographic mask has been produced in accordance with a process which includes (i) preparing a structure having a membrane and a mask substrate for supporting the membrane, wherein a pattern is to be formed on the membrane, (ii) applying a force to the structure so that distortion is produced in the membrane, and (iii) forming a pattern on the membrane with the force being applied to the membrane; and developing the workpiece having the pattern transferred thereto, for production of a device.

\* \* \* \* \*